United States Patent [19]
Metzler et al.

[11] Patent Number: 5,387,805
[45] Date of Patent: Feb. 7, 1995

[54] FIELD CONTROLLED THYRISTOR

[76] Inventors: Richard A. Metzler, 28232 Driza, Mission Viejo, Calif. 92692; Vladimir Rodov, 818 S. Juanita Ave., Redondo Beach, Calif. 90277

[21] Appl. No.: 177,686

[22] Filed: Jan. 5, 1994

[51] Int. Cl.[6] ............... H01L 29/74; H01L 29/747
[52] U.S. Cl. ................... 257/147; 257/152; 257/170; 257/174
[58] Field of Search .......... 257/147, 151, 152, 153, 257/170, 174, 133, 175

[56] References Cited

U.S. PATENT DOCUMENTS 4,502,070  2/1985  Leipold et al. ............... 257/148
5,202,750  4/1993  Gough ........................ 257/155

FOREIGN PATENT DOCUMENTS 5800174  1/1983  Japan ........................ 257/170

*Primary Examiner*—Rolf Hille
*Assistant Examiner*—Wael M. Fahmy
*Attorney, Agent, or Firm*—Hecker & Harriman

[57] ABSTRACT

A readily manufacturable field controlled thyristor with a first semiconductor region of n-type conductivity, a second semiconductor region of p-type in contact with said first region, a void penetrating through said first and second semiconductor regions, a fourth semiconductor region of n-type forming a channel adjacent to said void, a fifth semiconductor region, of p-type, in contact with said third region. The device has a large tolerance for deviations in process parameter precision and accuracy, which enables the device to be produced at a low cost.

17 Claims, 5 Drawing Sheets

FIELD CONTROLLED THYRISTOR

BACKGROUND OF THE INVENTION

1. FIELD OF THE INVENTION

This invention is directed to providing a readily manufacturable thyristor with gate current turn off capability.

2. BACKGROUND ART

A power thyristor is a switching device that is used to control the switching of large currents with a relatively small control current. A common application of a thyristor is to provide variable power to a device, for example a heater or a light bulb, connected to a constant line source. The amount of power delivered to the device during each cycle is determined by the time in the cycle that a current pulse is applied to the turn-on gate of the thyristor. A conventional prior art thyristor in FIG. 1. The device comprises an n+-type cathode 101, a p-type gate 102, an n-type substrate 103, a p+-type emitter 104, and contact means connected to regions 101, 102 and 104. The device is similar to a p-n-p-n diode, except that a gate is attached to one of the base regions.

When a positive bias is applied to the anode 104 and the cathode 101 that is smaller than the value required to initiate current flow through the thyristor, the thyristor is said to be in a forward blocking mode of operation. The voltage required to initiate current flow through a thyristor is called the forward-breakover voltage. The forward-breakover voltage decreases with increasing positive current to the gate 102. When a thyristor bias exceeds the forward-breakover voltage the thyristor goes into a low impedance, high current capacity, forward-conducting, on-state. A conventional thyristor latches in the forward conducting on-state, such that load current, between the anode 104 and the cathode 101, continues to flow even in the absence of gate current. To turn a conventional thyristor off, the load current must be reduced below a threshold value, called the holding current value. This is an undesirable feature for many thyristor applications because the switching time is relatively long and additional control circuitry is required. For a more detailed description of the operation of conventional thyristors see U.S. Pat. No. 4,935,798.

To turn off a conventional thyristor using gate current requires all of the anode-cathode current, henceforth referred to as load current, to be drawn out through the gate. This requires the use of a large gate thickness to handle the high currents. However, a large gate thickness eliminates current gain, as shown by the relationship $\beta_0 = (2L_p^2)/(W^2)$ where $\beta_0$ is the common emitter current gain, $L_p$ is the diffusion length of holes, and W is the width of the gate. This limitation among others has prevented many prior art thyristors from having the capability of turning off the load current using gate current.

Prior art designs have been limited by the effects of high current densities that form around the contact areas when the device is turned on. Small regions of the gate near the contacts begin conducting before the rest of the gate; hence, high current densities develop in these regions. This transient rapid increase in current density is known as the "di/dt" effect. The large localized instantaneous power dissipation that results from the high current density in the regions that first begin conducting may cause irreversible damage to the device.

A common cause of di/dt failures in prior art devices is inadequate gate current. When a small gate current is used to drive a thyristor, such that it is sufficient to barely turn the gate on, the entire gate does not start conducting immediately. Instead load current is localized in small conducting regions in the gate and undesirable high current densities result. Prior art designs have used a two stage turn on process to reduce these destructive localized high current densities. The first stage is turned on with a small gate current, and this first stage then drives the main gate of the thyristor with a substantially larger current. For example, the first stage may be turned on with only a 100 mA current. This first stage may then generate a several ampere current to drive the main thyristor gate and provide adequate current to turn on the whole gate. This regenerative gate structure has limited effectiveness and substantially increases the complexity of the device.

Another technique that has been used to minimize di/dt effects in prior art designs is to slow down the turn on process. This approach also has limited effectiveness, and has the substantial drawback of reducing the speed of the device which limits the applications in which the device can be used. An additional technique that is used to reduce di/dt effects is to increase the emitter area, however, this approach is also not sufficiently effective to eliminate the problem of di/dt failures.

The di/dt effect is illustrated in FIGS. 5A and 5B. In FIG. 5A, a graph of current versus time is illustrated for a prior art design. The current begins at a relatively low value and then slowly spreads over time. FIG. 5B illustrates current density versus time for the same device. After the current turns on, the current density can be several orders of magnitude greater than the steady state level. The change in current is occurring at a greater rate than the area change (i.e. the area available for transmitting current).

To minimize di/dt effects prior art designs have used a variety of techniques including increasing the surface area of the contacts and slowing down the turn on process of the device. These techniques have limited effectiveness.

There have been a variety of developments in the field of thyristors including the following:

U.S. Pat. No. 3,465,216, issued to Teszner, describes a semiconductor switching device having at least four layers of alternate P and N conductivity types with a rectifying P/N grid in one of the intermediate layers, and at least four terminals. The terminals are connected to the anode, cathode, the grid, and at least one other intermediate layer. The device is rendered conductive by the application of a pulse between the control electrode connected to the intermediate layer and the terminal connected to the nearest outside layer. The device is rendered non-conductive by the application of a pulse between the intermediate layer and grid.

U.S. Pat. No. 3,874,956, issued to Gamo et al., describes a method of making a semiconductor switching device comprising of a PNPN or NPNP structure having four semiconductor regions, one region of higher specific resistivity of two central regions of the four regions being sandwiched between a centrally positioned junction and one of the end junctions of three PN junctions formed between the four regions. The central region of higher specific resistivity involves impurities for controlling the lifetime of carriers, and its concentration distribution being such that the impurity concentration of that portion adjacent to the central junction is higher than that of the portion adjacent to the above mentioned end junction.

U.S. Pat. No. 4,032,961, issued to Baliga et al., discloses a geometrical design criteria for a Gate Modulated Bipolar Transistor, or GAMBIT, which is a three terminal variable negative resistance device. The GAMBIT is a planar, interdigited, integrated device whose electrical characteristics show a voltage controlled negative resistance between two of its terminals. The magnitude of the negative resistance is controlled by the variation of the applied bias to the third terminal.

U.S. Pat. No. 4,037,245, issued to Ferro, is directed to an electric field controlled semiconductor diode comprising a semiconductor substrate with a uniform anode injecting region formed in one major surface of the substrate and a current controlling surface grid formed in the other major surface. The interstices of the grid include a cathode region of high injection efficiency. Means for controlling the flow of electrical current between the anode and the cathode regions is also described.

U.S. Pat. No. 4,060,821, issued to Houston et al., describes a grid structure for a field controlled thyristor. The grid structure controls the current and is interdigited with a cathode structure in which the surface area of the cathode structure is substantially greater than that of the grid structure. High forward blocking voltage gain (anode voltage/grid voltage) and low on-state losses in a turn-off type field controlled thyristor are accomplished by providing a surface grid portion and a buried portion which is connected to the surface grid structure and substantially underlies the cathode structure. The buried grid structure is constructed in a manner to provide a high aspect ratio for the channel region. A p-type anode region is described in addition to a current controlling grid structure. The grid structure consists of individual surface adjacent p+-type regions contacting buried grid elements of p-type conductivity.

U.S. Pat. No. 4,514,747, issued to Miyata et al., is directed to a field controlled SCR. The thyristor comprises a first semiconductor region of n+-type, a second semiconductor region of n-type, third semiconductor regions of p-type, a fourth semiconductor region of n--type and a fifth semiconductor region of p+-type. These regions are formed on a semiconductor substrate having two main surfaces. The U.S. Pat. No. 4,514,747 embodiment has an n-type region in the center of the p-type gate to enable gate current to be used to turn off the load current. The impurity concentration in a region intervening between a heavily doped cathode region and a buried gate region decreases from the cathode to the gate region.

U.S. Pat. Nos. 4,872,044, and 4,935,798, both issued to Nishizawa et al., are divisions of U.S. Pat. No. 4,772,926, also issued to Nishizawa et al. These three patents, U.S. Pat. Nos. 4,872,044, 4,935,798, and 4,772,926, describe a field controlled thyristor with a low impurity concentration channel region having opposed first and second major surfaces, a first main electrode region having one conductivity type and a second main electrode region having another conductivity type opposite to the one conductivity type and provided on the first and second major surfaces, respectively, and a gate region provided in the vicinity of the first main electrode region There intervenes between the channel region and the second main electrode region a thin layer region having the same conductivity type as that of the first main electrode region. The provision of this thin layer region contributes to allowing a low impurity concentration as well as a decreased thickness of the channel region for a given maximum forward blocking voltage. A trapezoidal p+-type gate structure is also described.

U.S. Pat. No. 4,837,608, issued to Nishizawa et al., is directed to a double gate static induction thyristor comprising an n--type semiconductor substrate having first and second principal surfaces opposite to each other. A first gate electrode is formed on the first principal surface of the substrate, and a second gate electrode is formed on the second principal surface of the substrate.

U.S. Pat. No. 4,841,350, issued to Nishizawa, describes a static induction photothyristor having a nonhomogeneously doped gate. The photothyristor comprises a cathode, a gate, an anode, and bar components in the gate area with impurity densities which are unequal to each other.

U.S. Pat. No. 4,851,889, Matsuzaki, describes a conductivity modulated type field effect transistor, having a drain region of first conductivity type with an associated drain electrode, a conductivity modulating region of a second conductivity type opposed to that of the drain region, a channel region of the first conductivity type and a source region of the second conductivity type formed consecutively on top of one another. A gate is formed over the gate insulating film and a source electrode is formed over the channel forming region.

U.S. Pat. No. 4,984,049, issued to Nishizawa et al., describes static induction thyristor. A "buried gate" region is described including extended members disposed in a region of opposite conductivity type. Connections are made to a cathode region and an anode region that are formed on opposing surfaces of the structure. The gain of the thyristor of U.S. Pat. No. 4,984,049 is limited by a ratio of gate-anode length and the gate separation.

U.S. Pat. No. 4,985,738, issued to Nishizawa et al., describes a static induction thyristor having a split-gate structure, e.g., driving gates and non-driving gates, for controlling cathode-anode current flow. The split-gate structure comprises a plurality of primary gates formed in recesses of the channel region which respond to an external control signal for providing primary current control, and a plurality of secondary non-driving gates which are influenced by electric fields in the channel region extant during thyristor operation for providing secondary current control.

Previous designs, including U.S. Pat. No. 4,514,747 issued to Miyata et al., have used diffusion processes as well as epitaxial growth processes to create buried gate structures that incorporate diffusion wells or grid structures. These processes have demanding process requirements which limit their manufacturability. One such requirement is that the region around the gate well must be compensated to balance the dopant density of the well. When the dopant density of the region surrounding the diffusion well is too low, the well spreads out beyond the desired limits of the vertical channel. When the dopant density of the region surrounding the diffusion well is too high then the channel is too narrow and it may not penetrate the full depth of the gate region. A further requirement is that dopant concentration in the diffusion well must be tightly controlled because too high of a dopant concentration in the diffusion well degrades the depletability of the region, and too low of a dopant concentration impairs the turn-off capability of the device. The manufacturability limitations of the prior art devices have substantially limited their usage.

SUMMARY OF THE PRESENT INVENTION

The present invention is a readily manufacturable field controlled power thyristor. The device has several modes of operation. The device can function as a p-n junction diode with current flowing from the anode to the cathode through an n-type channel region in the p-type gate. The device can also function as a field controlled diode or a static induction transistor (SIT), in that when an electric field is applied through the gate, a depletion layer is formed in the n-type channel region, that shuts off the current through the channel region. When the density of the current through the n-type channel region in the on state becomes sufficiently high, the conduction area spreads throughout the gate region. The current flows through the gate directly to the anode. In this mode, the device functions as a conventional thyristor. Conventional thyristors can handle high power, however, they latch in the forward conducting on-state, such that load current continues to flow even in the absence of gate current. The present invention can be made to turn on with no external gate current. The present invention can also be made to operate in the SCR mode during the application of a positive gate current, and revert to an off state when the current is removed.

The present invention is formed as an n-p-n-p device with a void etched into the n+-type cathode layer and p-type gate layer, and an n-type channel region adjacent to the void and connecting the n-type substrate to the n+-type cathode layer. The device has a large tolerance for deviations in process parameter precision and accuracy; hence, the device can be produced at a low cost.

BRIEF DESCRIPTIONS OF THE DRAWINGS

DETAILED DESCRIPTION OF THE PRESENT INVENTION

The present invention provides a readily manufacturable field controlled thyristor. In the following description, numerous specific details are set forth such as voltage levels, current values, etc., in order to provide a more thorough understanding of the present invention. It will be apparent, however, to one skilled in the art, that the present invention may be practiced without these specific details. In other instances, well-known device characteristics have not been described in detail so as not to obscure the present invention.

Figure 2:
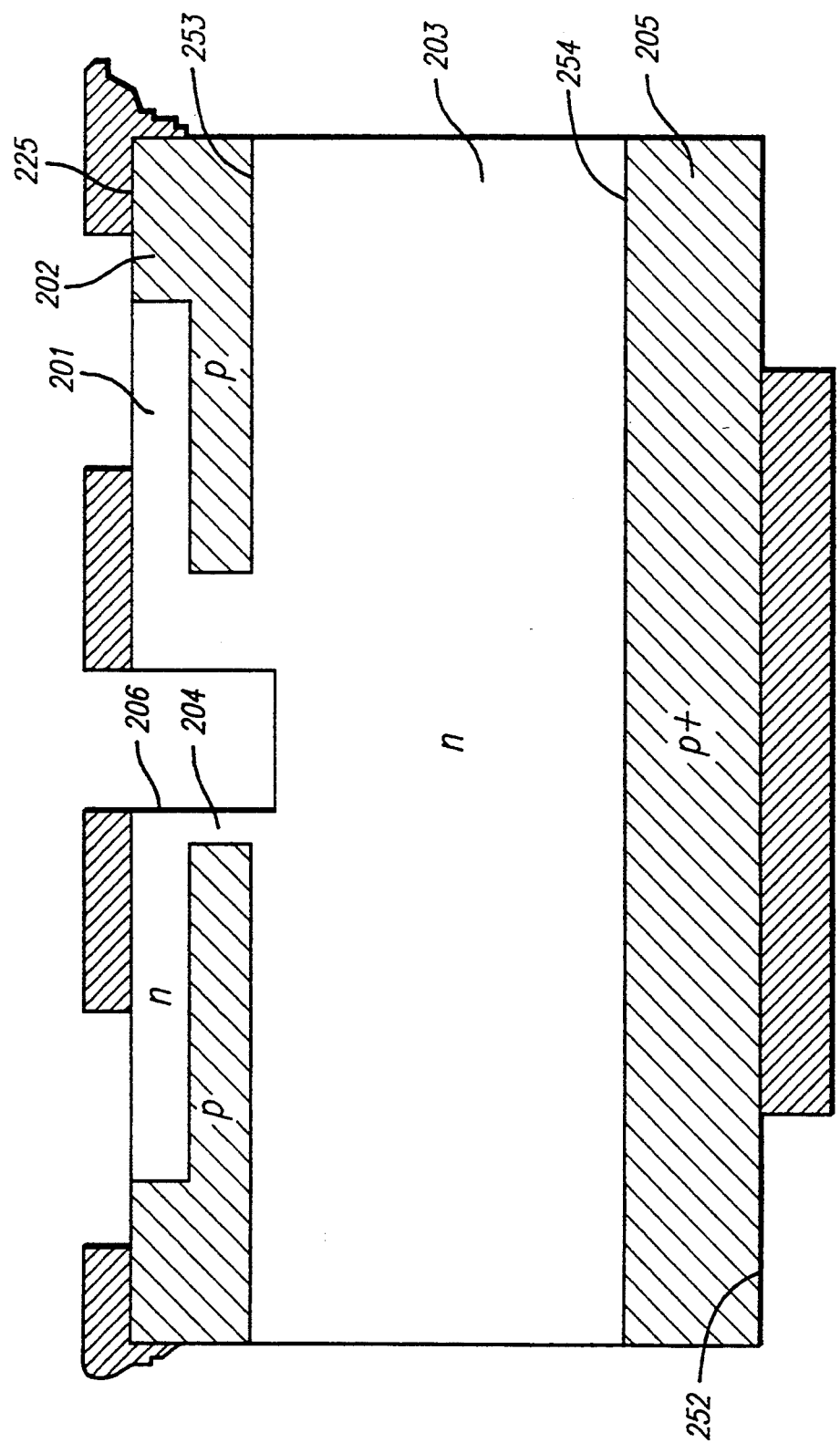
FIG. 2 shows a preferred embodiment of the invention.

FIG. 2 illustrates the preferred embodiment of the present invention comprising a field controlled thyristor with a semiconductor substrate 203 of n-type conductivity, a p-type lower emitter 205 adjacent to surface 254, a p-type gate 202 adjacent to surface 253, a void 206 in the central region of the gate 202, and a channel region 204 of n-type conductivity adjacent to the void 206, and connecting the substrate 203 to an n+-type cathode region 201, which is adjacent to surface 251. Contact means are attached to said n+-type cathode region 201. Second contact means are attached to the p-type gate 202. Third contact means are attached to the p-type lower emitter 205.

The channel width varies with channel doping, gate off voltage, and blocking potential. For example, with a channel width of 1 micron, the channel doping is approximately 0.3 times the finger doping (e.g. $5e^{15}$ finger doping). For a channel width of 4 micron, the ratio is approximately 0.1 times finger doping.

When a sufficiently large positive voltage is applied between the anode 205 and the cathode 201 current flows through the channel region 204. Increasing the forward bias causes an increase in the injection of minority carriers, and where the width of the gate region 202 is short compared to the minority carrier diffusion length, minority carriers diffuse through the gate and form a substantial part of the forward current. When carriers diffuse through a region in this manner, the region is described as being in a modulated mode. The entire gate of the present invention becomes modulated, causing current to flow through the entire gate region 202 and this reduces the forward voltage drop of the device in the on state to essentially that of a forward biased diode.

The present invention also provides a gate current controlled turn-off capability. In one embodiment of the invention the dopant density of the gate and the device geometry are defined such that when the same potential is applied to the gate 202 and the cathode 201 the modulation of the gate is stopped. The current then is limited to flowing through the channel 204. When a sufficiently large negative gate bias is applied, the depletion regions extend across the entire channel, and establish a potential barrier. This potential barrier prevents electrons from being injected at the cathode 201. The injection of holes at the anode then ceases because of the absence of a source of electrons. Hence, a gate current controlled method of turning off the load current is provided. This pinch off of the channel and prevention of the flow of current is similar in operation to a static induction transistor.

The void in the gate improves the performance of the device in several ways. The channel region 204 adjacent to the void 206 enables the present invention to turn on uniformly across the gate and thereby avoid undesirable di/dt effects. This is in contrast to conventional thyristors which turn on from the regions in the gate near the contacts towards the center of the gate. This non-uniform turn-on process results in di/dt effects including localized high current densities that may cause irreversible damage to the device. In the present invention, the channel 204 provides a current path which allows the region of the gate adjacent to the void to move in voltage, thereby establishing a voltage gradient in the gate between the central region and the perimeter. The gate dopant density, and the device geometry in the preferred embodiment balance the increase in voltage near the contacts, which causes conventional thyristors to turn on from the perimeter towards the center of the gate, with the modulation of the region of the gate adjacent to the channel 204, resulting from the current flow through the channel 204, to create a device that turns on uniformly. Hence, the present invention overcomes the problem of localized high current densities during the turn on process.

The present invention does not require a gate current to turn on. The channel develops a voltage across the gate finger region 204. This voltage causes the device to turn on by itself. This capability changes with concentration ratios. The self biasing of the gate caused by the channel produces the ability of the gate to move in potential enough to initiate the SCR effect within the device structure. Thus, the present invention may be turned on by opening the gate electrode, i.e. forcing the gate current to zero with no applied potential.

The greater the gate thickness, the lower its resistance, and the greater the diameter of the device can be and still allow current to be removed from the gate to turn off the load current. Correspondingly, the smaller the gate thickness is the higher the sheet resistance, and the larger the voltage drops are that develop across the gate. Hence, the diameter of the device must be kept smaller in order to be able to reduce the voltage at the end of the gate adjacent to the channel sufficiently to deplete the channel and turn the device off. The small cell size minimizes lateral gate resistance. (Lateral gate resistance determines the modality of the device). However, the greater the thickness of the gate the more demanding the requirements are to modulate it, which reduces turn on performance. Furthermore, a thicker gate increases the forward voltage drop of the device, which in turn increases the power dissipation and reduces the current capacity of the device.

A typical cell hole size is from approximately 1 to 10 microns. The hole may penetrate through the entire thickness of the gate region, but this is not a requirement because of the diffusion depth of the channel dopant. The cell size is from approximately 15 microns to 500 microns. The preferred embodiment is implemented with a cell width of approximately 20 to 40 microns and is designed to operate with a current density of approximately 200 to 400 A/cm$^2$.

A benefit of the void in the present invention is that at turn on, current always flows in the channel 204. This creates a second mechanism that changes the potential of the substrate region 203 at the outside edge of the gate as well, permitting more uniform current flow and allowing the entire region to conduct substantially simultaneously. The result is a current density curve with no peaks, that is, one that more closely tracks the steady state values. Thus, there is no di/dt effect.

The invention also improves turn off capabilities. In the prior art, the gate must collect all the load current when the gate is reverse biased. Prior art devices cannot handle the current, the junction is pushed to the breakdown point, and there is no longer any ability to control the device. The present invention, in turn off, permits some current to flow through the gate. However, part of the current flows through the channel, which acts as a static induction transistor. That current can be turned off with the field effect of the gate 202 in the channel region. Because the load current is distributed through two paths, the device of the present invention successfully turns off larger area devices than prior art thyristors.

In one embodiment of the invention when the same potential is applied to the gate 202 and the cathode 201 the modulation of the gate is stopped. The current then is limited to flowing through the channel 204. When a sufficiently large negative gate bias is applied, the depletion regions extend across the entire channel 204, and establish a potential barrier. This potential barrier prevents electrons from being injected at the cathode 201, which in turn prevents holes from being injected at the anode 205, and establishes a forward-blocking state. This pinch off of the channel and prevention of the flow of current is similar in operation to a static induction transistor.

In the present invention, the device has a voltage blocking gain (Vg/Vca) of approximately 150. This gain may be lower for low voltage devices. Vg is in the range of approximately 2 to 10 V for the off state. Other ratios and voltages may be used without departing from the scope of the present invention.

Figure 4:
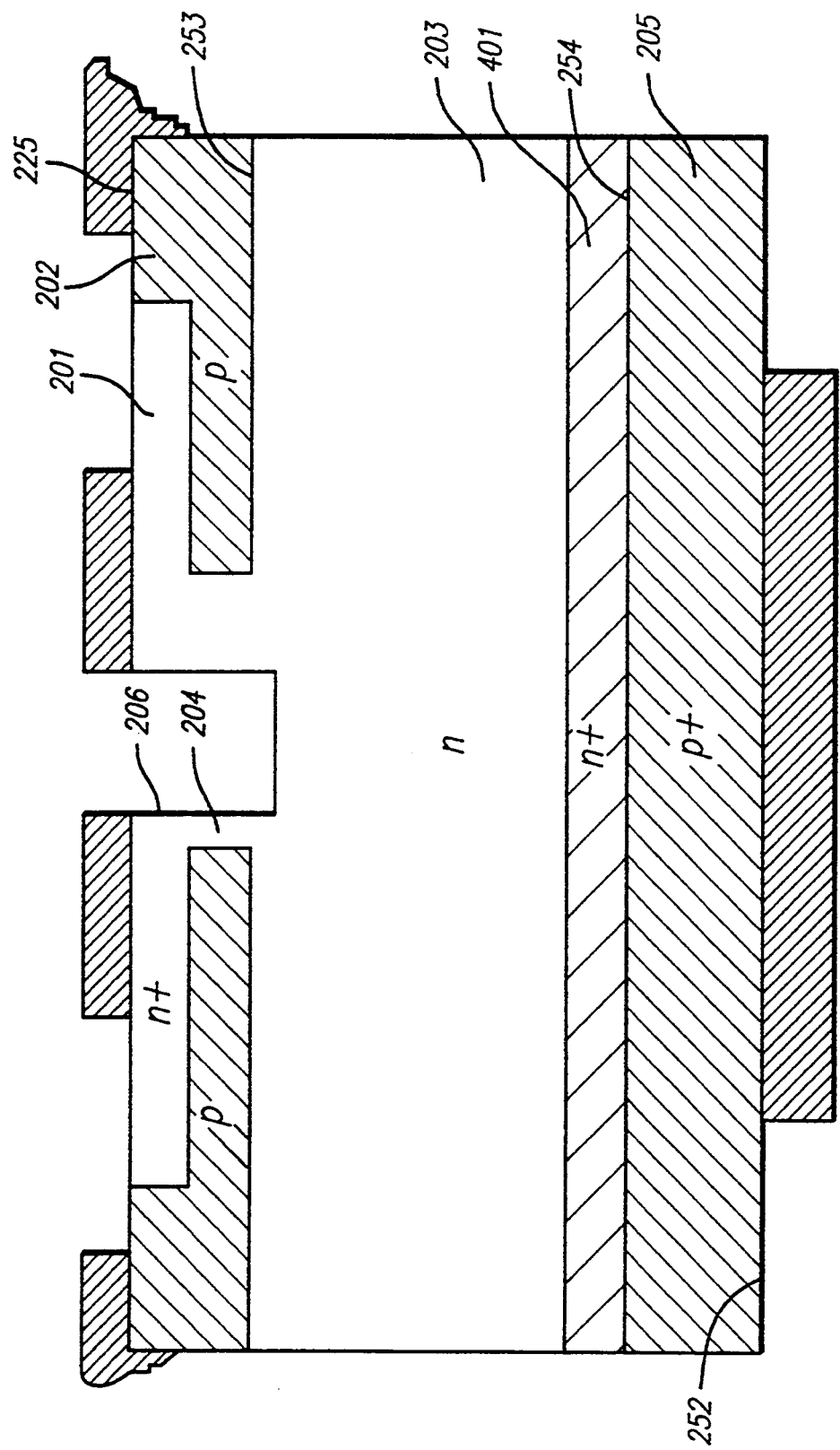
FIG. 4 shows an alternative embodiment of the invention that includes an emitter efficiency reduction layer.
Figure 5A:
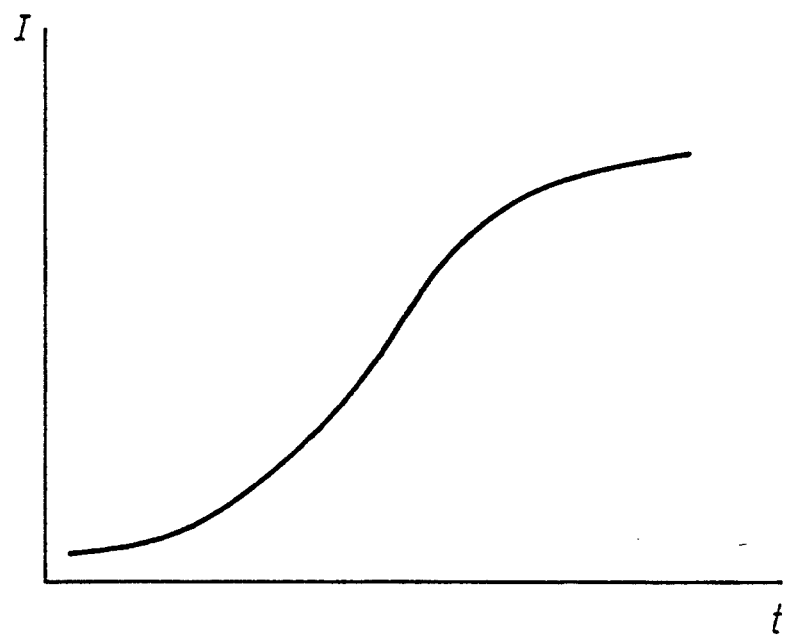
FIGS. 5A and 5B illustrate current behavior for prior art thyristors.
Figure 5B:
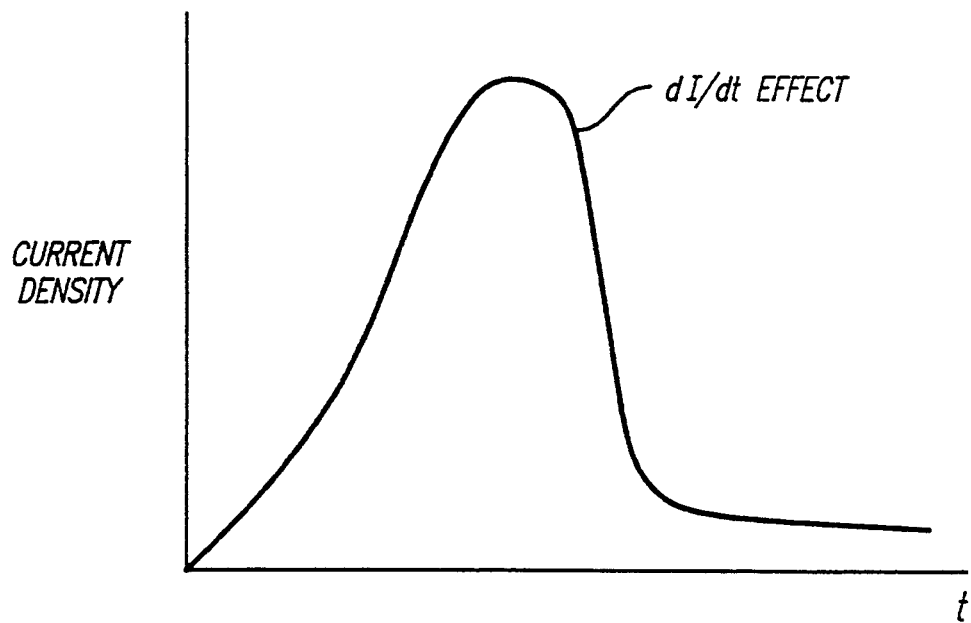

In an alternative embodiment, an injection efficiency reduction layer is used, as shown in FIG. 4. The injection efficiency reduction layer 401 improves the maximum blocking voltage capability of the device. The injection efficiency, defined as the ratio of the injected hole current compared to the total emitter current which includes electron and hole components, must be kept low to maintain a high breakdown voltage. When the injection efficiency is not kept low, the hole current increases for a given bias voltage, and thereby reduces the breakdown voltage. To keep the injection efficiency low, a thin n+-type layer 401 with a dopant density of $10^{17}$ atoms/cm$^3$ and thickness of 1-2 $\mu$m, between the n-type substrate 203 and the p-type lower emitter 205 is used.

An additional alternative embodiment of the invention provides a solid state equivalent of a Klystron oscillator, in that it is a source of microwave frequency signals. When an electron plasma is localized the plasma develops instabilities and goes into oscillations. The geometry of the channel region 204 adjacent to the void, and the other device structures can be designed to localize an electron plasma to create an oscillatory system. The device, when placed in a resonant cavity, provides a source of microwave frequency oscillations.

Figure 1:
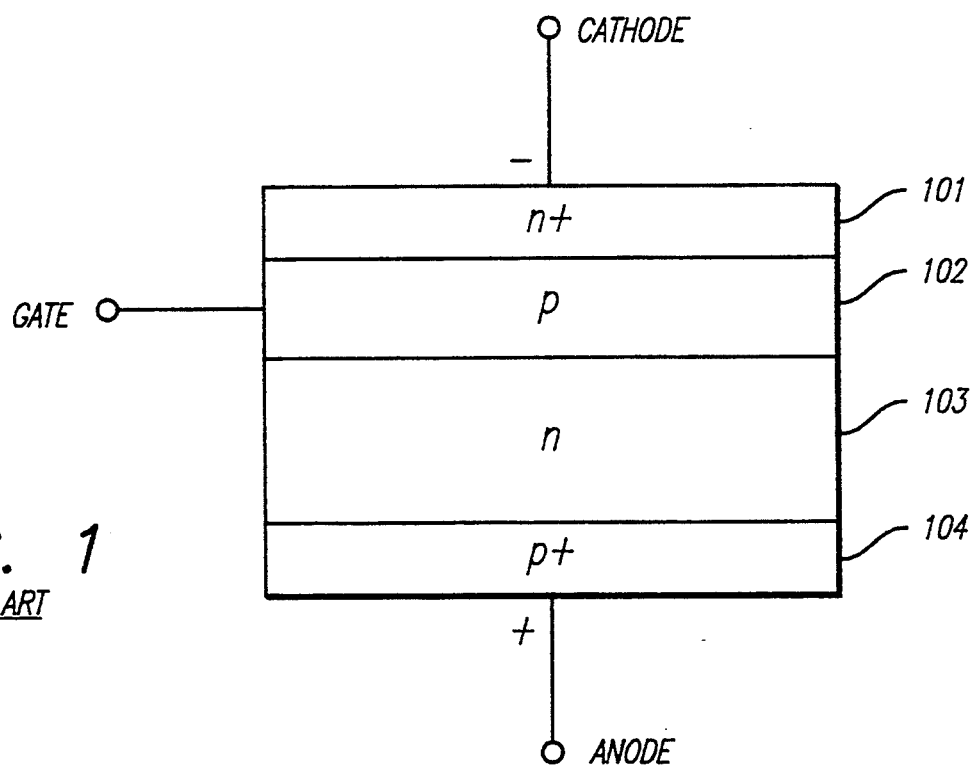
FIG. 1 shows a conventional prior art thyristor.
Figure 3A:
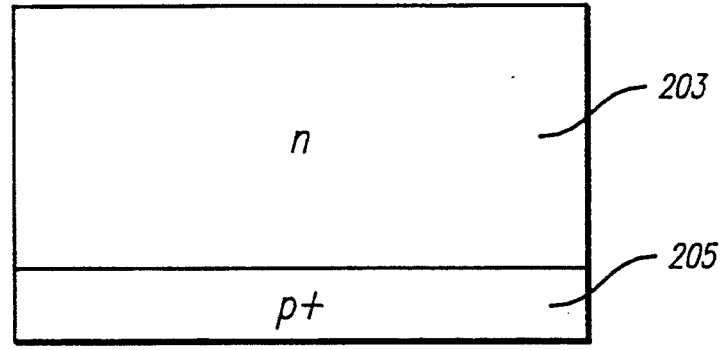
FIGS. 3A to 3E show cross sections of the invention at several points in the fabrication process.
Figure 3B:
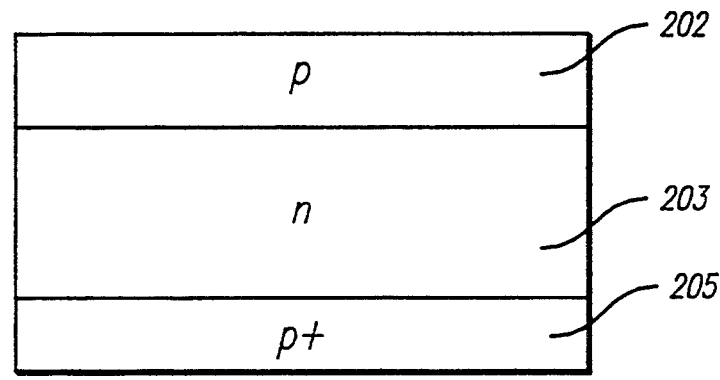
Figure 3C:
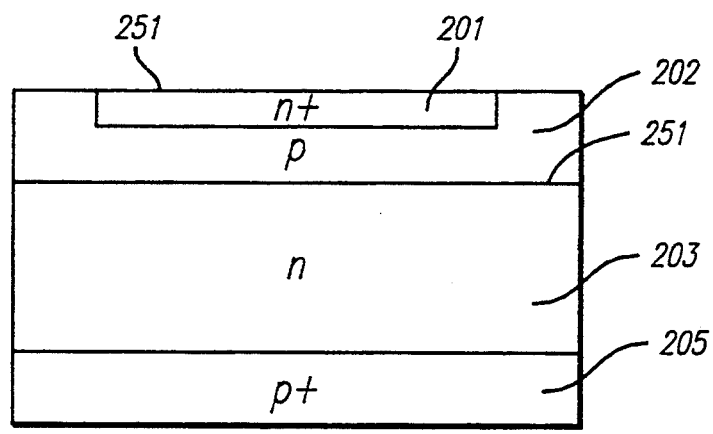

One method of fabricating the device comprises diffusing into first n-type substrate surface 252 a p+-type lower emitter region 205, as shown in FIG. 3A, of for example $10^{18}$ atoms/cm$^3$ dopant density. As shown in FIG. 3B, a p-type gate region 202, with a dopant density of for example $10^{16}$ atoms/cm$^3$, is diffused into second substrate surface 251 of the n-type substrate to form a gate layer of about 40 $\mu$m. As shown in FIG. 3C, an n+-type cathode region 201 is then diffused into second substrate surface 251.

Figure 3D:
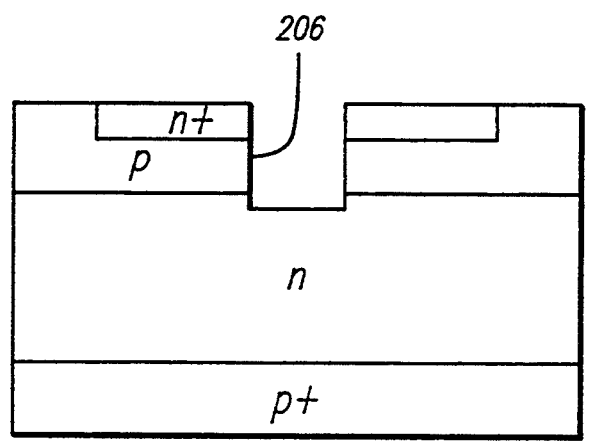

As shown in FIG. 3D, a silicon etch is used to create a void 206 in the silicon. Alternatively, the silicon can be cut to create the void 206. The void 206 may be a variety of shapes including a slot in the preferred embodiment or a cylinder in an alternative embodiment. A typical width of the void is 25 $\mu$m, however this dimension has a large tolerance.

Figure 3E:
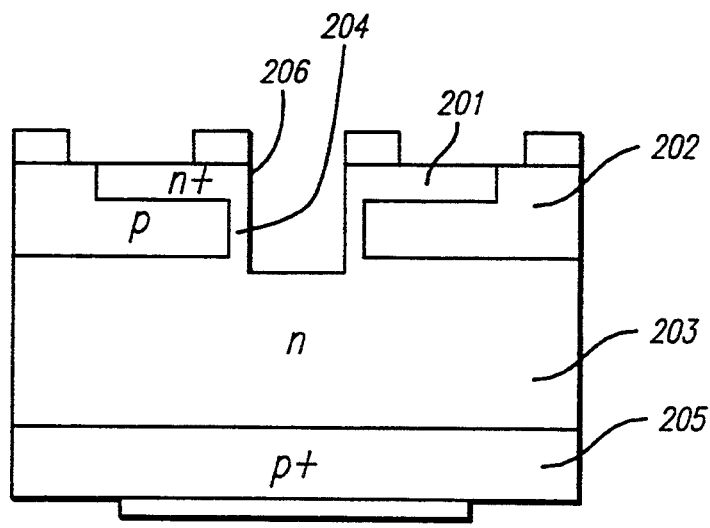

As shown in FIG. 3E, a lateral diffusion is made through the void 206 to make a channel 204 through the gate 202. The lateral diffusion process provides substantially greater capability of creating a narrow diffusion with a long length along an axis perpendicular to the plane of the gate. For example the void may be 20 $\mu$m deep, and the channel may have a thickness of only 2 $\mu$m. A lateral diffusion process is superior to a vertical diffusion process because for every unit of distance a diffusion extends in one direction it will also diffuse a certain amount along a perpendicular axis. Thus vertical diffusions are limited by a maximum depth to width ratio. Compensation of surrounding regions may be used to improve the maximum depth to width ratio, however, the tendency of a diffusion to spread remains a critical limiting factor in device geometry. The use of a cut or etched void in the gate in conjunction with a laterally diffused channel region, overcomes this limitation.

Contact means are attached to the n+-type cathode region 201. Second contact means are attached to the p-type gate region 202. Third contact means are attached to the p-type lower emitter 205. The device has a large tolerance for deviations in process parameter precision and accuracy, which enables the device to be produced at a low cost.

Thus a readily manufacturable field controlled thyristor device and a method for making such a device have been described.

We claim:

1. A field controlled thyristor comprising:
   a first semiconductor region of a first conductivity type in ohmic contact with external contact means;
   a gate comprising a second semiconductor region of a second conductivity type, said gate in ohmic contact with said first semiconductor region and external contact means;
   a third semiconductor region, of said first conductivity type, in ohmic contact with said second semiconductor region;
   a fourth semiconductor region, of said first conductivity type, connecting said first semiconductor region and said third semiconductor region;
   a fifth semiconductor region, of said second conductivity type, in ohmic contact with said third semiconductor region and external contact means; and
   said first semiconductor region having a void therein extending through said first semiconductor region, said second semiconductor region and said fourth semiconductor region, said fourth semiconductor region forming a channel between said void and said second semiconductor region.

2. The thyristor of claim 1 wherein said void is a slot.

3. The thyristor of claim 2 wherein said void is a cylinder.

4. The thyristor of claim 1 wherein said first conductivity type is n-type.

5. The thyristor of claim 1 wherein said first conductivity type is p-type.

6. The thyristor of claim 1 wherein said void extends into said third semiconductor region.

7. The thyristor of claim 1 wherein said channel region has a width along an axis parallel to the plane of the gate that is smaller than the thickness, along an axis perpendicular to the plane of the gate, of said first, second, third, and fifth semiconductor regions.

8. The thyristor of claim 1 wherein said channel region has a width along an axis parallel to the plane of the gate that is about 2 μm.

9. A field controlled thyristor comprising:
   a first semiconductor region of a first conductivity type in ohmic contact with external contact means;
   a gate comprising a second semiconductor region of a second conductivity type, said gate in ohmic contact with said first semiconductor region and external contact means;
   a third semiconductor region, of said first conductivity type, in ohmic contact with said second semiconductor region;
   a fourth semiconductor region, of said first conductivity type, connecting said first semiconductor region and said third semiconductor region;
   a fifth semiconductor region, of said first conductivity type, having a higher dopant density than said third semiconductor region, in ohmic contact with said third semiconductor region;
   said first semiconductor region having a void therein extending through said first semiconductor region, said second semiconductor region, and said fourth semiconductor region, said fourth semiconductor region forming a channel between said void and said second semiconductor region; and
   a sixth semiconductor region, of said second conductivity type, in ohmic contact with said fifth semiconductor region and external contact means.

10. The thyristor of claim 9 wherein said void is a slot.

11. The thyristor of claim 9 wherein said void is a cylinder.

12. The thyristor of claim 9 wherein said first conductivity type is n-type.

13. The thyristor of claim 9 wherein said first conductivity type is p-type.

14. The thyristor of claim 9 wherein said void extends into said third semiconductor region.

15. The thyristor of claim 9 wherein said channel region has a width along an axis parallel to the plane of the gate that is smaller than the thickness, along an axis perpendicular to the plane of the gate, of said first, second, third, and sixth semiconductor regions.

16. The thyristor of claim 9 wherein said fifth semiconductor region has a thickness of about 1 μm.

17. The thyristor of claim 9 wherein said channel region has a width along an axis parallel to the plane of the gate that is about 2 μm.

* * * * *

UNITED STATES PATENT AND TRADEMARK OFFICE
CERTIFICATE OF CORRECTION

PATENT NO. : 5,387,805
DATED : February 7, 1995
INVENTOR(S) : METZLER, Richard A., et al.

It is certified that error appears in the above-identified patent and that said Letters Patent is hereby corrected as shown below:

On the title page, please add:

--[73] Assignee: Semicoa Semiconductors, Costa Mesa, California.--

Signed and Sealed this

Second Day of July, 1996

Attest:

Attesting Officer

BRUCE LEHMAN

Commissioner of Patents and Trademarks